United States Patent
Cho et al.

(10) Patent No.: US 10,411,079 B2
(45) Date of Patent: Sep. 10, 2019

(54) ORGANIC LIGHT EMITTING DISPLAY DEVICE REDUCING LEAKAGE CURRENT GENERATED BETWEEN PIXELS

(71) Applicant: LG DISPLAY CO., LTD., Seoul (KR)

(72) Inventors: Jungmo Cho, Seoul (KR); Hanbyeol Seok, Seoul (KR); Sohee Lee, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/174,707

(22) Filed: Jun. 6, 2016

(65) Prior Publication Data
US 2016/0380035 A1  Dec. 29, 2016

(30) Foreign Application Priority Data
Jun. 25, 2015 (KR) .......... 10-2015-0090586

(51) Int. Cl.
*H01L 27/32* (2006.01)
*H01L 51/50* (2006.01)

(52) U.S. Cl.
CPC ...... *H01L 27/3246* (2013.01); *H01L 51/5056* (2013.01); *H01L 51/5088* (2013.01)

(58) Field of Classification Search
USPC ................. 257/E51.022, E51.019; 438/4, 23
See application file for complete search history.

(56) References Cited

U.S. PATENT DOCUMENTS

| | | | |
|---|---|---|---|
| 2004/0085014 A1 | 5/2004 | Park | |
| 2005/0174044 A1* | 8/2005 | Miura | H01L 27/3211 313/504 |
| 2006/0028131 A1* | 2/2006 | Yamazaki | H01L 27/322 313/506 |
| 2010/0044691 A1* | 2/2010 | Hong | H01L 27/3276 257/40 |
| 2014/0361260 A1* | 12/2014 | Kim | H01L 27/3246 257/40 |
| 2016/0155785 A1* | 6/2016 | Sato | H01L 51/5088 257/40 |

FOREIGN PATENT DOCUMENTS

CN    1499902 A    5/2004

* cited by examiner

*Primary Examiner* — Sheng-Bai Zhu
(74) *Attorney, Agent, or Firm* — Dentons US LLP

(57) ABSTRACT

Provided is an organic light emitting display device including at least two organic light emitting elements disposed adjacent to each other, respectively including an anode, an organic light emitting unit, and a cathode, and sharing at least one common layer in the organic light emitting unit. The at least one common layer includes a characteristic degradation area that reduces or minimizes an amount of leakage current generated between the at least two organic light emitting elements.

18 Claims, 5 Drawing Sheets

ORGANIC LIGHT EMITTING DISPLAY DEVICE REDUCING LEAKAGE CURRENT GENERATED BETWEEN PIXELS

CROSS-REFERENCE TO RELATED APPLICATIONS

This application claims the priority of Korean Patent Application No. 10-2015-0090586 filed on Jun. 25, 2015, in the Korean Intellectual Property Office, the disclosure of which is incorporated by reference for all purposes as if fully set forth herein.

BACKGROUND

Field

The present disclosure relates to an organic light emitting display device and a method of manufacturing the same. More particularly, the present disclosure relates to an organic light emitting display device in which an amount of leakage current generated between pixels can be reduced or minimized.

Description of the Related Art

An organic light emitting display (OLED) device is a next-generation display device having a self-luminance characteristic. The OLED device includes an organic light emitting element including two electrodes and an organic light emitting layer disposed between the two electrodes. The organic light emitting element uses the principle of generating light by recombination of electrons and holes injected into the organic light emitting layer from the respective two electrodes.

The OLED device does not need a separate light source like a liquid crystal display device. Thus, the OLED device can be manufactured into a lightweight and thin form factor. Further, the OLED device exhibits excellent characteristics with respect to viewing angle, contrast ratio, response speed, and power consumption, as compared with the liquid crystal display device. Therefore, the OLED device has received much attention as a next-generation display device.

SUMMARY

The present disclosure is directed to an organic light emitting display device and a method of manufacturing the same that substantially obviate one or more problems due to limitations and disadvantages of the related art.

An organic light emitting element may have a common light emitting layer structure or a patterned light emitting layer structure.

An organic light emitting element having the common light emitting layer structure may have a structure in which a plurality of organic light emitting layers for emitting a white light are laminated between two electrodes. For example, the plurality of organic light emitting layers may include a blue light emitting layer and a yellow light emitting layer. Further, organic layers, such as an injecting layer, a transporting layer, and the like, for improving characteristics of the element may be further disposed between the two electrodes. The plurality of organic layers included in the organic light emitting element having the common light emitting layer structure is formed using a common mask. Therefore, the organic layers can be laminated into the same structure in all pixels without a pattern for each pixel.

An organic light emitting element having the patterned light emitting layer structure may have a structure in which organic light emitting layers respectively emitting different colors are separated between two electrodes in respective pixels. For example, the organic light emitting layers may include red, blue, and green organic light emitting layers. Each of the organic light emitting layers may be deposited and patterned using a mask, for example, a fine metal mask (FMM), open to each pixel. Further, like the organic light emitting element having the common light emitting layer structure, organic layers such as an injecting layer, a transporting layer, and the like may be further disposed between the two electrodes.

An OLED device may include the organic light emitting element having the common light emitting layer structure or the organic light emitting element having the patterned light emitting layer structure. In the OLED device, a display quality may deteriorate due to a current leaking to an unintended area, i.e., an area where a light should not emitted. Details thereof will be described below.

In an OLED device including the organic light emitting element having the common light emitting layer structure, a plurality of organic layers is formed into the same structure in all pixels using a common mask as described above. Herein, the plurality of organic layers may be formed into the same structure not only on a pixel area where a light is emitted but also on a non-pixel area, for example, a bank disposed between pixels, where a light is not emitted. That is, the plurality of organic layers are formed using the common mask which is open to both the pixel area and the non-pixel area. Therefore, the plurality of organic layers may be disposed as being connected to each other throughout the pixel area and the non-pixel area. In this case, when the OLED device is driven, a current may leak through the plurality of organic layers disposed in the non-pixel area. Thus, in addition to a pixel being driven, pixels adjacent thereto may unnecessarily emit lights. Herein, organic layers sharing at least two pixel areas and disposed as being connected to each other in the at least two pixel areas and a non-pixel area therebetween may be referred to as a common layer.

Further, since the plurality of organic light emitting layers are disposed as a common layer in a pixel area and a non-pixel area, a portion of the non-pixel area may emit a light due to a current leaking to the non-pixel area. Therefore, a light may be unnecessarily emitted from an undesired pixel or area, which may cause color mixing between pixels and thus deteriorate a display quality.

In an OLED device including the organic light emitting element having the patterned light emitting layer structure, at least one organic layer among the other organic layers except organic light emitting layers separated in respective pixel areas may be formed as a common layer sharing pixels depending on a design. In this case, when the OLED device is driven, a current may leak through the organic layers disposed in a non-pixel area. Thus, pixels adjacent to a pixel being driven may unnecessarily emit lights.

Further, when organic light emitting layers are deposited in each pixel using the FMM, the organic light emitting layers may be unnecessarily formed in a portion of the non-pixel area due to a mask alignment error. That is, the organic light emitting layers may be disposed as being connected to each other in a pixel area and a portion of the non-pixel area. In this case, the portion of the non-pixel area where the organic light emitting layers are deposited may also emit a light due to a current leaking to the non-pixel area. This may cause color mixing between pixels and thus deteriorate a display quality.

Accordingly, an object to be achieved by the present disclosure is to provide an OLED device in which at least one common layer disposed on pixels and a bank therebetween includes a characteristic degradation area, and, thus, a current leaking to an undesired area may be minimized.

The objects of the present disclosure are not limited to the aforementioned objects, and other objects, which are not mentioned above, will be apparent to a person having ordinary skill in the art from the following description.

According to an aspect of the present disclosure, there is provided an OLED device including: at least two organic light emitting elements disposed adjacent to each other, respectively including an anode, an organic light emitting unit, and a cathode, and sharing at least one common layer in the organic light emitting units. According to an aspect of the present disclosure, the at least one common layer includes a characteristic degradation area that reduces or minimizes an amount of leakage current generated between the two organic light emitting elements. This is to reduce color mixing between pixels caused by a light emitted from an undesired area due to leakage current.

According to another aspect of the present disclosure, there is provided an OLED device including: a first anode and a second anode separated from each other on a substrate; a bank between the two anodes, the bank covering ends of the two anodes; an organic light emitting unit including at least one common layer covering the first anode, the second anode, and the bank; and a cathode on the organic light emitting unit. According to another aspect of the present disclosure, the at least one common layer includes an area corresponding to the bank and an area corresponding to the first anode or the second anode, and a current characteristic of the area corresponding to the bank is different from a current characteristic of the area corresponding to the first anode or the second anode. This is to reduce a leakage of current to an undesired area.

According to yet another aspect of the present disclosure, there is provided an OLED device including two adjacent pixels and a bank that separates the two pixels. The OLED device includes: a common layer covering the pixels and the bank; and an organic light emitting layer on the common layer for each of the pixels. According to yet another aspect of the present disclosure, on the bank, a partial area of the common layer where a portion of the organic light emitting layer is covered has a structure where element characteristics are degraded so as to reduce or minimize an amount of leakage current flowing to the common layer and thus suppress undesired emission from the bank. This is to reduce deterioration in display quality caused by color mixing between adjacent pixels.

According to the present disclosure, at least one common layer disposed on pixel areas and a non-pixel area therebetween includes a characteristic degradation area. Therefore, a current leaking to an undesired area can be reduced.

Accordingly, it is possible to reduce emission from the undesired area.

Further, color mixing between pixels can be reduced. Therefore, there is an effect of improving a display quality of an OLED device.

The effects of the present disclosure are not limited to the aforementioned effects, and other effects, which are not mentioned above, will be apparent to a person having ordinary skill in the art from the following description.

The objects to be achieved by the present disclosure, the aspects, and the effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1A:
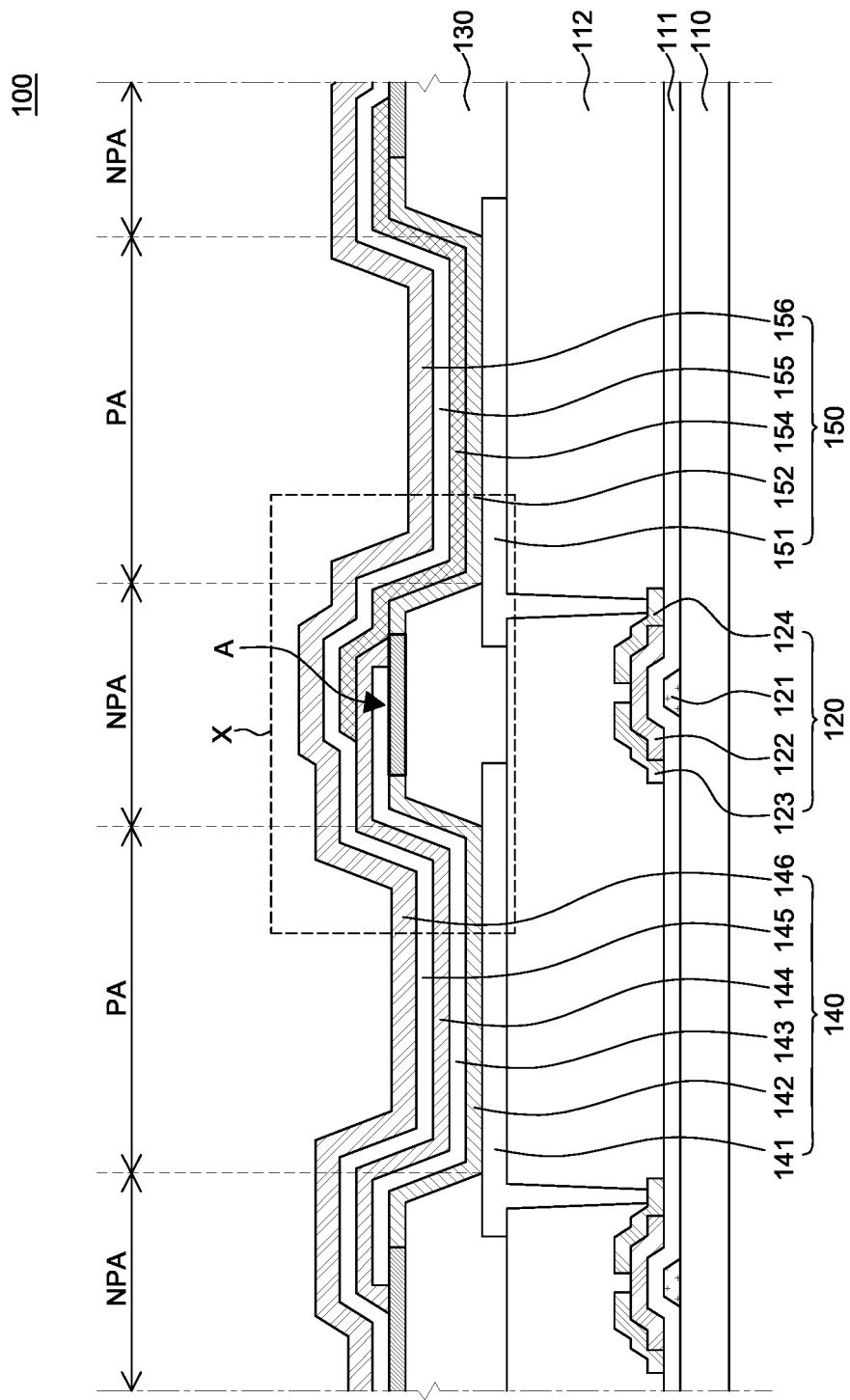
FIG. 1A is a cross-sectional view of an OLED device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like shown in the accompanying drawings for describing the exemplary embodiments of the present disclosure are merely examples, and the present disclosure is not limited thereto. Like reference numerals generally denote like elements throughout the present specification. Further, in the following description, a detailed explanation of well-known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, an organic light emitting display device according to exemplary embodiments of the present disclosure will be described in detail with reference to the accompanying drawings.

Figure 1B:
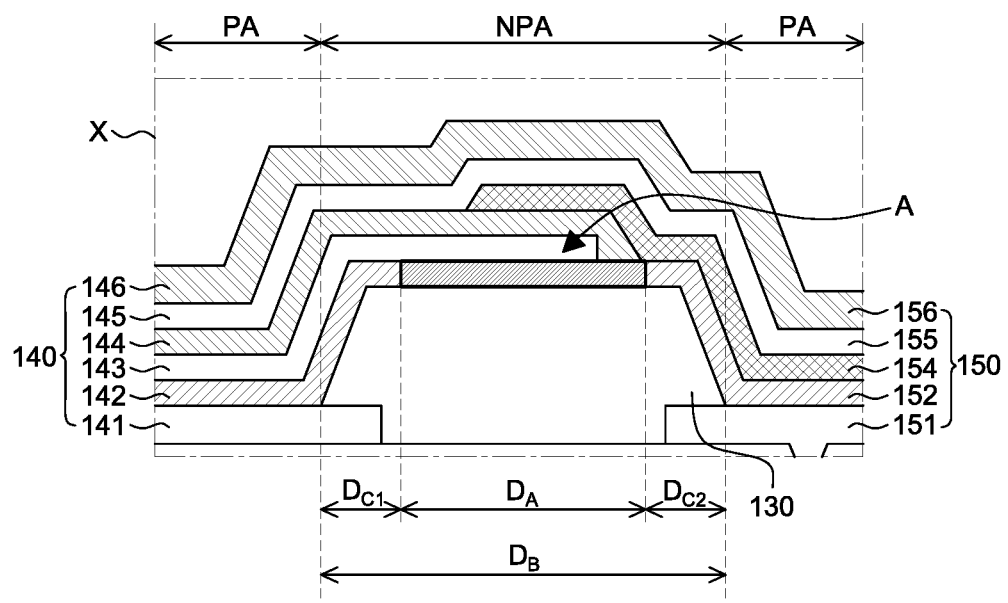
FIG. 1B is an enlarged view of a portion X in FIG. 1A.

FIG. 1A is a cross-sectional view of an organic light emitting device (hereinafter, referred to as "OLED device") 100 according to an exemplary embodiment of the present disclosure, and FIG. 1B is an enlarged view of a portion X in FIG. 1A.

Referring to FIG. 1A, the OLED device 100 includes a substrate 110, a thin film transistor (hereinafter, referred to as "TFT") 120, a bank 130, a first organic light emitting element 140, and a second organic light emitting element 150.

The substrate 110 may be formed of an insulation material, and may be formed of a flexible film, for example, a glass or polyimide-based material.

The substrate 110 includes a pixel area PA and a non-pixel area NPA. The pixel area PA refers to a unit area where light is actually emitted. The non-pixel area NPA where light is not emitted is disposed between the two adjacent pixel areas PA. The pixel area PA may also be simply referred to as a pixel or a sub-pixel.

A plurality of TFTs 120 each connected to the organic light emitting elements 140 and 150 and configured to supply signals to the organic light emitting elements 140 and 150 is disposed on the substrate 110. The TFT 120 illustrated in FIG. 1A may be a driving thin film transistor connected to anodes 141 and 151 of the organic light emitting elements 140 and 150, respectively. A switching thin film transistor or a capacitor for driving the organic light emitting elements 140 and 150 may be further disposed in the pixel area PA.

The TFT 120 includes a gate electrode 121, an active layer 122, a source electrode 123, and a drain electrode 124. As illustrated in FIG. 1A, the gate electrode 121 is formed on the substrate 110, and a first insulation layer 111 covers the gate electrode 121. The active layer 122 is disposed on the first insulation layer 111 so as to be overlapped with the gate electrode 121. The source electrode 123 and the drain electrode 124 are disposed to be separated from each other on the active layer 122.

The gate electrode 121, the source electrode 123, and the drain electrode 124 are formed of conductive materials. They may be formed of, for example, any one among molybdenum (Mo), aluminum (Al), chromium (Cr), gold (Au), titanium (Ti), nickel (Ni), neodymium (Nd), and copper (Cu) or alloys thereof, but are not limited thereto, and may be formed of various materials.

The active layer 122 may be formed of any one among amorphous silicon (a-Si), polycrystalline silicon (poly-Si), oxide, and an organic material according to the kind of the active layer 122, but is not limited thereto.

The first insulation layer 111 may include a single layer or a plurality of layers formed of an inorganic material, and may be formed of silicon oxide ($SiO_x$), silicon nitride ($SiN_x$), and the like.

FIG. 1A illustrates the TFT 120 as having a staggered structure, but is not limited thereto. The TFT 120 may have a coplanar structure. Further, if the OLED device 100 is a bottom-emission type, light of the organic light emitting element 140 penetrates the substrate 110 and is emitted in a downward direction. Therefore, the TFT 120 may be disposed in the non-pixel area NPA as illustrated in FIG. 1A. If the OLED device 100 is a top-emission type, light of the organic light emitting element 140 penetrates cathodes 146 and 156 and is emitted in an upward direction. Therefore, the TFT 120 may be disposed to be overlapped with the anodes 141 and 151.

A second insulation layer 112 that exposes a portion of the drain electrode 124 is disposed on the TFT 120. The second insulation layer 112 may include a single layer or a plurality of layers and may be formed of an organic material. The second insulation layer 112 may be formed of polyimide, acryl, and the like.

A passivation layer may be further formed between the second insulation layer 112 and the TFT 120. The passivation layer may be formed of an inorganic material, may protect the TFT 120, and may also expose a portion of the drain electrode 124 in the same manner as the second insulation layer 112.

Each of the organic light emitting elements 140 and 150 is disposed on the second insulation layer 112 so as to correspond to the pixel area PA. More specifically, FIG. 1A illustrates the organic light emitting elements 140 and 150 having a patterned light emitting layer structure. As described above, the organic light emitting elements 140 and 150 having a patterned light emitting layer structure may have a structure in which organic light emitting layers 144 and 154 respectively emitting different colors are separated in the respective pixel areas PA. Each of the organic light emitting layers 144 and 154 may be deposited and patterned using a mask, for example, a fine metal mask (FMM), configured to have openings for each pixel.

The first organic light emitting element 140 includes a first anode 141, a common hole transporting layer 142, a first hole transporting layer 143, a first organic light emitting layer 144, a common electron transporting layer 145, and the cathode 146.

The second organic light emitting element 150 includes a second anode 151, a common hole transporting layer 152, a second organic light emitting layer 154, a common electron transporting layer 155, and the cathode 156.

The first anode 141 and the second anode 151 are configured to supply holes to the first and second organic light emitting layers 144 and 154 and disposed to be separated from each other in the respective pixel areas PA. Further, each of the first anode 141 and the second anode 151 is connected to the TFT 120 and receives a driving signal. The first anode 141 and the second anode 151 may be formed of a transparent conductive oxide (TCO) material such as indium tin oxide (ITO) or indium zinc oxide (IZO). If the OLED device 100 is a top-emission type, each of the first anode 141 and the second anode 151 may further include a reflective layer having a metal material. Further, in the drawings, although the anodes 141 and 151 are illustrated as being connected to the drain electrode 124 of the TFT 120, the anodes 141 and 151 may be connected to the source electrode 123.

The bank 130 separates the pixel areas PA and is disposed corresponding to the non-pixel area NPA. As illustrated in FIG. 1A, the bank 130 is disposed to cover an end of the first anode 141 and an end of the second anode 151. The bank 130 may be formed of an organic material, for example, any one among polyimide and acryl resin.

The common hole transporting layers 142 and 152 are disposed on the first anode 141 and the second anode 151, respectively, and share a plurality of adjacent pixel areas PA. Referring to FIG. 1A, the common hole transporting layers 142 and 152 are disposed as being connected to each other so as to cover the first anode 141, the second anode 151, and the bank 130. And the common hole transporting layers 142 and 152 may also be referred to as a common layer.

The common hole transporting layers 142 and 152 smoothly transfer holes supplied from the anodes 141 and 151 to the first and second organic light emitting layers 144 and 154, respectively. Also, the common hole transporting layers 142 and 152 may be electron blocking layers or have such functionality to block a flow of electrons in the first and second organic light emitting layers 144 and 154 to the common hole transporting layers 142 and 152, respectively.

Referring to FIG. 1A and FIG. 1B, the common hole transporting layers 142 and 152 include a characteristic degradation area A that is specifically configured to reduce or minimize an amount of leakage current generated between the two adjacent organic light emitting elements 140 and 150. The common hole transporting layers 142 and 152 share the pixel areas PA, and, thus, may be referred to as a common layer.

As described above, the common layer is disposed in the adjacent pixel areas PA and the non-pixel area NPA therebetween. Therefore, a display quality may deteriorate due to a leakage current to an undesired area. For example, when the first organic light emitting element 140 is driven, a current flowing to the first organic light emitting element 140 may leak to the non-pixel area NPA and the second organic light emitting element 150 through the common hole transporting layers 142 and 152. In this case, although a signal is not applied to the second organic light emitting element 150, light may be emitted from the second organic light emitting element 150. This may cause undesirable color mixing between adjacent pixels and thus deteriorate a display quality.

In the OLED device 100 according to an exemplary embodiment of the present disclosure, the characteristic degradation area A is formed or located in a portion of the common hole transporting layers 142 and 152 in order to minimize a leakage current between adjacent pixels. Referring to FIG. 1B, the characteristic degradation area A is disposed between the two adjacent pixel areas PA so as to correspond to at least one among a portion of the non-pixel area NPA and the bank 130. The characteristic degradation area A may a barrier or other structure serving a similar purpose for reducing a leakage current to an undesired area.

The characteristic degradation area A may be formed by irradiating ultraviolet (UV) rays (or other types of energy) to a specific area of the common hole transporting layers 142 and 152. If the UV rays are irradiated to the specific area of the common hole transporting layers 142 and 152 using a mask, bonds of molecules constituting an organic material of the UV ray-irradiated area are broken. Thus, properties of the organic material are changed. Therefore, the UV ray-irradiated area becomes the characteristic degradation area A of the common hole transporting layers 142 and 152. The characteristic degradation area A has a higher driving voltage and a lower efficiency than another area B, for example, an area of the common hole transporting layers 142 and 152 corresponding to the first anode 141 or the second anode 151. Further, the characteristic degradation area A may be degenerated by the UV rays and may turn darker in color than the other area B. Furthermore, the characteristic degradation area A is in a state where many bonds of molecules constituting the organic material are broken as compared with the other area B of the common hole transporting layers 142 and 152. Therefore, the characteristic degradation area A may have a lower energy absorption rate than that of the other area B. For example, an energy absorption rate of the characteristic degradation area A may be lower by about 50% than that of the other area B, and such can be analyzed by using Raman spectroscopy.

A maximum current flowing in the characteristic degradation area A may be lower than a maximum current flowing in the common layer, for example, the other area B of the common hole transporting layers 142 and 152. Specifically, the characteristic degradation area A is an area where element characteristics are degraded by the UV rays and thus has a current characteristic different from that of the other area B of the common hole transporting layers 142 and 152. Further, a maximum current flowing in the characteristic degradation area A is lower than a maximum current flowing in the other area B. In other words, a maximum current which can flow in the characteristic degradation area A has a low value. Therefore, when the OLED device 100 is driven, a leakage current flowing to the adjacent pixel area PA through the common hole transporting layers 142 and 152 may not be further transferred due to the characteristic degradation area A formed in the non-pixel area NPA. The maximum current which can flow in the characteristic degradation area A may be decreased when the bonds of the molecules constituting the organic material of the common hole transporting layers 142 and 152 are broken by the UV rays. Further, the maximum current which can flow in the characteristic degradation area A may need to have a lower value than a maximum current which can flow in the other area B. And, the maximum current which can flow in the characteristic degradation area A may have a lower value than a leakage current at which a light can be emitted from the adjacent pixel area PA or the non-pixel area NPA. In this case, the characteristic degradation area A functions as a barrier that minimizes a current leaking through the common hole transporting layers 142 and 152. Therefore, it is possible to reduce color mixing between pixels which may be caused by a leakage current to an undesired area such as the adjacent pixel area PA or the non-pixel area NPA. Thus, it is possible to reduce deterioration in display quality.

Referring to FIG. 1B, a width DA of the characteristic degradation area A disposed in the non-pixel area NPA may have a value of 10% to 60% of a maximum straight distance DB from one side surface of the bank 130 covering the end of the first anode 141 to the other side surface of the bank 130 covering the end of the second anode 151. The characteristic degradation area A can be formed by irradiating UV rays using a mask. Therefore, for example, the width DA of the characteristic degradation area A may be configured to have a value of 60% or less considering a mask manufacturing error or a UV ray irradiation process margin. If the width DA of the characteristic degradation area A has a value of lower than 10%, it may be difficult for the characteristic degradation area A to sufficiently function as a barrier to a leakage current. Further, if the width DA of the characteristic degradation area A has a value of higher than 60%, heat energy caused by irradiation of the UV rays may be undesirably transferred to the pixel area PA and may cause damage to the organic light emitting elements 140 and 150. Thus, the efficiency may be decreased. Therefore, for example, the characteristic degradation area A may be formed at or near a central portion of the non-pixel area NPA or at or near a central area on the bank 130. To be specific, for example, a distance DC1 from the one side surface of the bank 130 covering the end of the first anode 141 to the characteristic degradation area A may have a value of 20% or more of the maximum straight distance DB of the bank 130. Further, for example, a distance DC2 from the other side surface of the bank 130 covering the end of the second anode 151 to the characteristic degradation area A may have a value of 20% or more of the maximum straight distance DB of the bank 130.

Further, if UV irradiation energy is applied to a specific area of the common layer to form the characteristic degradation area A, UV output power may have a value of 10 $W/m^2$ to 30 $W/m^2$. The UV irradiation energy is the product of intensity (output power)×time. Therefore, if the output power is increased, an irradiation time can be reduced. Thus, a process tack time can be reduced. However, if the UV output power is increased too much, an area adjacent to the area targeted for UV irradiation may also deteriorate. If the output power is reduced to suppress such a problem, an irradiation time may need to be increased to apply sufficient energy for forming the characteristic degradation area A to the specific area of the common layer. That is, if the UV output power has a value lower than 10 $W/m^2$, a UV irradiation time may be increased until the characteristic degradation area A can sufficiently function as a barrier to undesirable leakage current. Therefore, a process tack time may be increased. Further, if the UV output power has a value higher than 30 $W/m^2$, too much heat energy may be transferred to the UV ray-irradiated area. Thus, the adjacent pixel area PA may also deteriorate. Accordingly, this trade-off relationship between UV output power and processing time can be considered and adjusted based upon various factors, such as display panel size, the operation environment in which the display panel is to be implemented, as the like. For example, in a relatively small-sized panel, the leakage current amount may be relatively small compared to that of a large-sized panel, and thus a relatively small characteristic degradation area A may be sufficient, which would require relatively low UV output power and also relatively short processing time.

The first organic light emitting layer 144 and the second organic light emitting layer 154 are disposed on the common hole transporting layer 142 so as to correspond to the respective pixel areas PA. The first organic light emitting layer 144 and the second organic light emitting layer 154 may be formed of phosphorescent or fluorescent materials respectively emitting different colors. For example, each of the first organic light emitting layer 144 and the second organic light emitting layer 154 may be one among red, green, and blue organic light emitting layers and different from each other.

Each of the first organic light emitting layer 144 and the second organic light emitting layer 154 may be deposited and patterned using a mask, for example, a fine metal mask (FMM), configured to have openings for each pixel. In this process, as illustrated in FIG. 1A and FIG. 1B, the first organic light emitting layer 144 and the second organic light emitting layer 154 may be formed to be overlapped on the non-pixel area NPA, specifically the bank 130, due to a mask alignment error. Therefore, light may be undesirably emitted from a portion of the non-pixel area NPA due to a current leaking through the common hole transporting layers 142 and 152.

In an exemplary embodiment of the present disclosure, on the bank 130, the characteristic degradation area A is formed in a portion of the common hole transporting layers 142 and 152 corresponding to an area where a portion of the first organic light emitting layer 144 and the second organic light emitting layer 154 is covered. Thus, it is possible to reduce undesirable light emissions from the non-pixel area NPA caused by a leakage current to the non-pixel area NPA. In other words, on the bank 130, a partial area of the common hole transporting layers 142 and 152 where a portion of the first organic light emitting layer 144 and the second organic light emitting layer 154 is covered has a structure where element characteristics are degraded. Thus, it is possible to minimize a leakage current which can flow to the common hole transporting layers 142 and 152 and also possible to suppress undesired light emissions from the non-pixel area NPA or the bank 130.

The common electron transporting layers 145 and 155 are disposed on the first organic light emitting layer 144 and the second organic light emitting layer 154. The common electron transporting layers 145 and 155 enable a smooth transfer of electrons injected from the cathodes 146 and 156, and may be formed as a common layer sharing pixel areas PA.

The cathodes 146 and 156 are configured to supply electrons and disposed on the common electron transporting layers 145 and 155 so as to share pixel areas PA. The cathodes 146 and 156 may be formed of a metal material or transparent conductive oxide (TCO) material such as indium tin oxide (ITO) or indium zinc oxide (IZO). If the OLED device 100 is a top-emission type, the cathodes 146 and 156 may be formed of a metal material having a very small thickness, for example, about 400 Å or less. In this case, light from the organic light emitting layers 144 and 154 may penetrate the cathodes 146 and 156 and may be emitted in an upward direction.

An encapsulation unit configured to protect the organic light emitting elements 140 and 150 from infiltration of moisture and/or oxygen may be further disposed on the cathodes 146 and 156.

The first organic light emitting element 140 and the second organic light emitting element 150 may have different laminated, layered or stacked structures. For example, as illustrated in FIG. 1A, the first organic light emitting element 140 may further include the first hole transporting layer 143 depending on luminescent materials of the organic light emitting layers 144 and 154 included in the organic light emitting elements 140 and 150, respectively. Further, each of the organic light emitting elements 140 and 150 may further include organic layers such as a hole injecting layer, and an electron injecting layer, or such functionality could be implemented into other layers.

The plurality of organic layers between the anodes 141 and 151 and the cathodes 146 and 156 may be referred to as an organic light emitting unit. As described above, the organic light emitting unit may have a structure including at least one common layer sharing pixel areas PA.

Therefore, according to an exemplary embodiment of the present disclosure, the OLED device 100 including the two adjacent pixel areas PA and the bank 130 that separates the pixel areas PA includes at least one common layer covering the two pixel areas PA and the organic light emitting layer disposed on the common layer so as to correspond to the respective pixel areas PA. Further, according to an exemplary embodiment of the present disclosure, on a specific area of the at least one common layer, specifically the bank 130, a partial area of the common layer where a portion of the organic light emitting layer has a structure where element characteristics are degraded. Thus, it is possible to minimize a leakage current which can flow to the common layer and thus possible to suppress undesired emission from the bank 130. Further, since the leakage current flowing to the common layer is minimized, undesired emission from the adjacent pixel area PA is reduced. Therefore, it is possible to reduce deterioration in display quality caused by color mixing.

Figure 2:
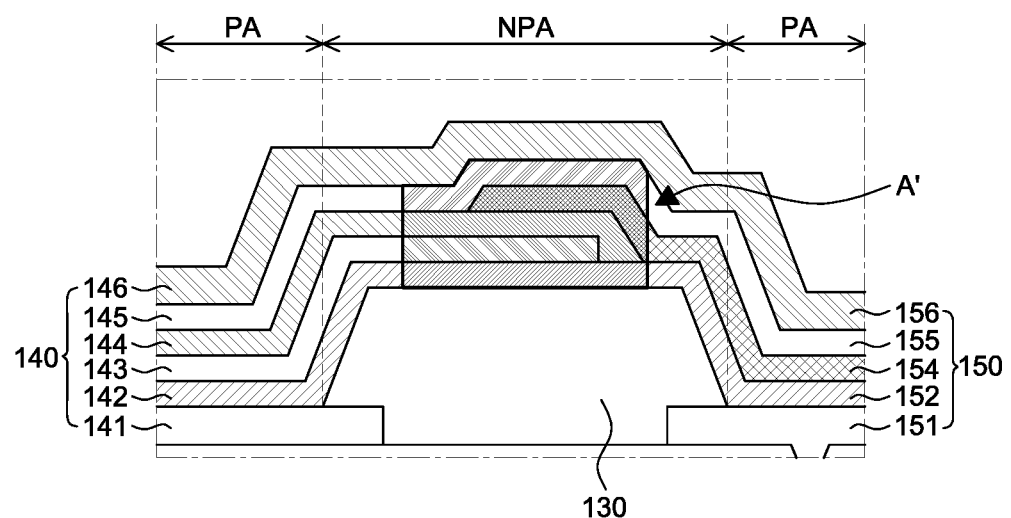
FIG. 2 is a cross-sectional view of an OLED device according to another exemplary embodiment of the present disclosure.

FIG. 2 is a cross-sectional view of an OLED device according to another exemplary embodiment of the present disclosure. More specifically, FIG. 2 is an enlarged view corresponding to another exemplary embodiment where only the portion X in FIG. 1A is modified. The OLED device illustrated in FIG. 2 is different from the exemplary embodiment illustrated in FIG. 1A and FIG. 1B only in a structure of a characteristic degradation area. Therefore, for convenience in explanation, the detailed description of components identical or corresponding to those of the above-described exemplary embodiment will be omitted.

Referring to FIG. 2, a characteristic degradation area A' may be formed to be included in a plurality of organic layers corresponding to at least a portion of the non-pixel area NPA, more specifically all of organic layers disposed on the bank 130. That is, FIG. 1B illustrates that the characteristic degradation area A is included only in the common hole transporting layers 142 and 152 as one among the common layers included in the organic light emitting unit. However, FIG. 2 illustrates that all of organic layers disposed on the bank 130 include the characteristic degradation area A'.

As described above, the characteristic degradation area A' can be formed by irradiating UV rays, and refers to an area where bonds of molecules constituting an organic material are broken by the UV rays and element characteristics are degraded. Accordingly, a value of a maximum current which can flow in the characteristic degradation area A' is decreased, and, thus, the amount of leakage current is decreased. Therefore, it is possible to reduce color mixing caused by light emission from an undesired area.

The characteristic degradation area A' may be included only in one organic layer or may be included in a plurality of organic layers depending on the process timing of irradiating UV rays. For example, UV rays may be irradiated to a specific area on the bank 130 after the common hole transporting layers 142 and 152 are deposited. In this case, as illustrated in FIG. 1B, the characteristic degradation area A may be included only in the common hole transporting layers 142 and 152. Otherwise, UV rays may be irradiated to a specific area on the bank 130 after the common hole transporting layers 142 and 152, the first hole transporting layer 143, the first organic light emitting layer 144, the second organic light emitting layer 154, and the common electron transporting layers 145 and 155 are deposited. In this case, as illustrated in FIG. 2, all the organic layers 142, 143, 144, 145, 152, 154, and 155 on the bank 130 corresponding to the UV ray-irradiated area may include the characteristic degradation area A'.

In the OLED device according to another exemplary embodiment of the present disclosure, as illustrated in FIG. 2, the characteristic degradation area A' is included in all the organic layers disposed on the bank 130. Thus, a leakage current to the adjacent pixel areas PA can be further reduced. That is, the characteristic degradation area A' between the two adjacent pixel areas PA functions as a barrier to minimize a leakage current. Therefore, it is possible to reduce a leakage current to an unintended area. Further, the characteristic degradation area A' is formed in a portion of the organic light emitting layers 144 and 145 unnecessarily extended and deposited on the bank 130 due to a mask alignment error. In other words, element characteristics in a portion of the organic light emitting layers 144 and 145 disposed in the non-pixel area NPA are degraded. Therefore, it is possible to further reduce emission from the non-pixel area NPA caused by a leakage current. Accordingly, color mixing between adjacent pixels can be reduced. Therefore, there is an effect of improving a display quality of an OLED device.

Figure 3:
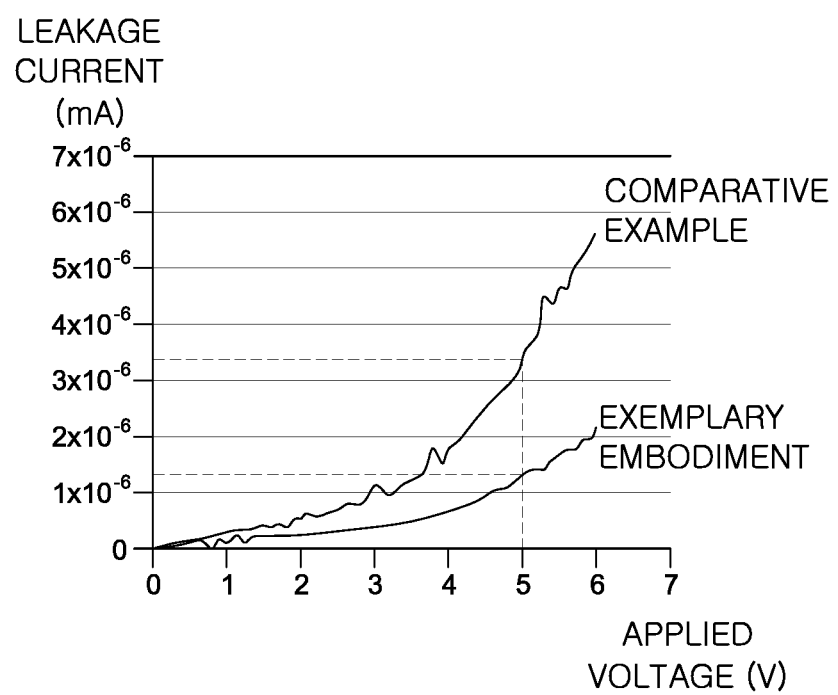
FIG. 3 is a graph showing a leakage current of an OLED device according to an exemplary embodiment of the present disclosure.

FIG. 3 is a graph showing a leakage current of an OLED device according to an exemplary embodiment of the present disclosure.

In an exemplary embodiment illustrated in FIG. 3, a characteristic degradation area is formed in a non-pixel area, specifically at a plurality of organic layers disposed on a bank between adjacent pixel areas. FIG. 3 provides a graph showing a measurement result of a leakage current flowing to a non-pixel area depending on a voltage applied to an organic light emitting element disposed in a pixel area.

By comparison, Comparative Example illustrated in FIG. 3 has a general structure where a characteristic degradation area is not formed in a plurality of organic layers disposed on a bank between adjacent pixel areas. Likewise, FIG. 3 provides a graph showing a measurement result of a leakage current flowing to a non-pixel area depending on a voltage applied to an organic light emitting element disposed in a pixel area.

Referring to FIG. 3, it can be seen that the leakage current in the structure where a characteristic degradation area is included in an OLED device is drastically decreased as compared with the leakage current in the structure where a characteristic degradation area is not included. For example, if a voltage of 5 V is applied to an OLED device, in the structure where a characteristic degradation area is not included (Comparative Example), a leakage current flowing to the non-pixel area is about $3.75 \times 10^{-6}$ mA. On the other hand, in the structure where a characteristic degradation area is included (exemplary embodiment), a leakage current flowing to the non-pixel area is about $1.25 \times 10^{-6}$ mA, which is decreased by about 66.7% as compared with the structure of Comparative Example.

Therefore, in the OLED device according to an exemplary embodiment of the present disclosure, a characteristic degradation area is formed in a common layer sharing pixel areas. Thus, it is possible to effectively reduce the amount of leakage current generated between pixel areas. Accordingly, there is an effect of reducing undesired light emissions from an adjacent pixel or non-pixel area.

Figure 4:
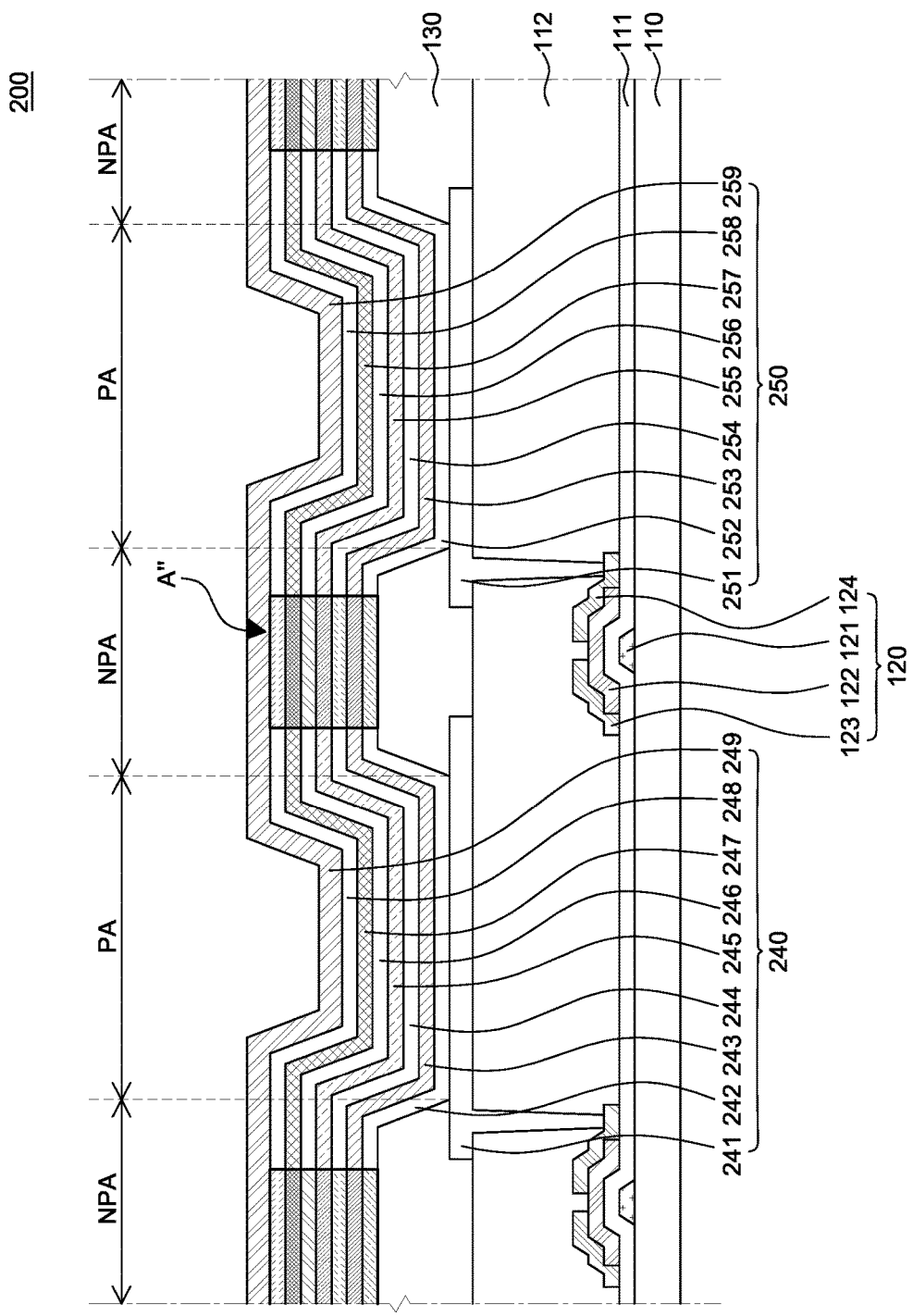
FIG. 4 is a cross-sectional view of an OLED device according to yet another exemplary embodiment of the present disclosure.

FIG. 4 is a cross-sectional view of an OLED device according to yet another exemplary embodiment of the present disclosure. The OLED device illustrated in FIG. 4 is different from the exemplary embodiment illustrated in FIG. 1A and FIG. 1B in a structure of an organic light emitting element. Therefore, for convenience in explanation, the detailed description of components identical or corresponding to those of the above-described exemplary embodiment will be omitted.

Each of organic light emitting elements 240 and 250 illustrated in FIG. 4 has a common light emitting layer structure including a plurality of organic light emitting layers 243, 247 and 253, 257 for emitting a white light between two electrodes 241, 249 and 251, 259. As described above, in the organic light emitting elements 240 and 250 having the common light emitting layer structure, a plurality of organic layers are formed using a common mask. Therefore, the organic layers in the pixel area PA and the non-pixel area NPA have the same structure. That is, as illustrated in FIG. 4, the plurality of organic layers are formed using the common mask with openings corresponding to both the pixel area and the non-pixel area. Therefore, the plurality of organic layers may be disposed as being connected to each other throughout the pixel area and the non-pixel area.

The organic light emitting elements 240 and 250 include anodes 241 and 251, first hole transporting layers 242 and 252, first organic light emitting layers 243 and 253, first electron transporting layers 244 and 254, charge generating layers 245 and 255, second hole transporting layers 246 and 256, second organic light emitting layers 247 and 257, second electron transporting layers 248 and 258, and cathodes 249 and 259, respectively. Herein, the first hole transporting layers 242 and 252, the first organic light emitting layers 243 and 253, the first electron transporting layers 244 and 254, the charge generating layers 245 and 255, the second hole transporting layers 246 and 256, the second organic light emitting layers 247 and 257, and the second electron transporting layers 248 and 258 share pixel areas PA and thus may be referred to as a common layer.

In an OLED device 200 according to yet another exemplary embodiment of the present disclosure, a plurality of organic layers included in the organic light emitting elements 240 and 250 include a characteristic degradation area A" in a specific area. Specifically, the characteristic degradation area A" included in the plurality of organic layers is disposed corresponding to the non-pixel area NPA between the pixel area PA and the pixel area PA as illustrated in FIG. 4. More specifically, the characteristic degradation area A" is disposed in an area corresponding to the bank 130.

The characteristic degradation area A" refers to an area where element characteristics are degraded. A maximum current which can flow in the characteristic degradation area A" may have a lower value than a maximum current which can flow in another area. That is, when the OLED device 200 is driven, the characteristic degradation area A" functions as a barrier that minimizes a current leaking to the adjacent pixel areas PA through the plurality of organic layers as a common layer. Accordingly, it is possible to reduce light emissions from an undesired area, for example, a non-pixel area NPA or a pixel area PA adjacent to a pixel area PA being driven. Thus, it is possible to reduce color mixing between pixels. Therefore, there is an effect of improving a display quality of the OLED device 200.

The exemplary embodiments of the present disclosure can also be described as follows.

According to an aspect of the present disclosure, an OLED device includes at least two organic light emitting elements disposed adjacent to each other, respectively including anode, organic light emitting unit, and cathode, and sharing at least one common layer in the organic light emitting unit. The at least one common layer includes a characteristic degradation area that minimizes the amount of leakage current generated between the two organic light emitting elements.

The OLED device further includes a bank between the at least two organic light emitting elements. The at least one common layer may be disposed to cover the bank.

The characteristic degradation area may correspond to at least one portion of the bank.

A width of the characteristic degradation area may have a value of 10% to 60% of a maximum straight distance from one side surface of the bank covering an end of an anode in one of the organic light emitting elements to the other side surface of the bank covering an end of an anode in the other one of the organic light emitting elements.

Each of a distance from the one side surface of the bank to the characteristic degradation area and a distance from the other side surface of the bank to the characteristic degradation area may have a value of 20% or more of the maximum straight distance.

The characteristic degradation area may be formed by irradiating an ultraviolet (UV) ray.

The characteristic degradation area may have a darker than another area of the at least one common layer.

A maximum current flowing in the characteristic degradation area may be lower than a maximum current flowing in another area of the at least one common layer.

The at least one common layer may include at least one among a hole injecting layer, a hole transporting layer, an organic light emitting layer, an electron transporting layer, an electron injecting layer, and a charge generating layer.

According to another aspect of the present disclosure, an OLED device includes a first anode and a second anode disposed to be separated from each other on a substrate, a bank between the first and the second anode covering an end of the first anode and an end of the second anode, an organic light emitting unit including at least one common layer covering the first anode, the second anode, and the bank and a cathode on the organic light emitting unit. The at least one common layer includes an area corresponding to the bank and an area corresponding to the first anode or the second anode, and a current characteristic of the area corresponding to the bank is different from a current characteristic of the area corresponding to the first anode or the second anode.

A maximum current flowing in the area corresponding to the bank may be lower than a maximum current flowing in the area corresponding to the first anode or the second anode.

The area corresponding to the bank may be formed by irradiating an ultraviolet (UV) ray.

The at least one common layer may include at least one among a hole injecting layer, a hole transporting layer, an organic light emitting layer, an electron transporting layer, an electron injecting layer, and a charge generating layer.

The area corresponding to the bank may have a darker than the area corresponding to the first anode or the second anode.

According to yet another aspect of the present disclosure, an OLED device includes two adjacent pixels; a bank that separates the two pixels; a common layer covering the pixels and the bank; and an organic light emitting layer on the common layer, each of the pixels having the organic light emitting layer. On the bank, a partial area of the common layer where a portion of the organic light emitting layer is covered is configured to so as to minimize a leakage current flowing to the common layer and suppress undesired emission from the bank, by having a structure where element characteristics are degraded.

The partial area of the common layer where the portion of the organic light emitting layer is covered may be formed by unnecessarily depositing the organic light emitting layer due to a mask alignment error.

The structure where element characteristics are degraded may be formed by irradiating an ultraviolet (UV) ray to the partial area of the common layer.

A maximum current flowing in the area may be lower than a maximum current flowing in another area of the common layer.

The common layer may include at least one of a hole injecting layer and a hole transporting layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising: at least two organic light emitting elements adjacent to each other, respectively including an anode, a cathode, and an organic light emitting unit comprising a plurality of organic layers including an organic light emitting layer, wherein the at least two organic light emitting elements share at least one common layer among the plurality of organic layers in the organic light emitting elements, a bank between the at least two organic light emitting elements; an area on the common layer corresponding to where at least one of the organic light emitting layers of the at least two organic light emitting elements adjacent to each other overlap, and a characteristic degradation area formed on the area in the common layer corresponding to where the at least one of the organic light emitting layers of the at least two organic light emitting elements adjacent to each other overlap, wherein the characteristic degradation area is configured to reduce an amount of leakage current generated between the two organic light emitting element, and wherein the characteristic degradation area is disposed so as not to overlap with the anode, and wherein a width of the characteristic degradation area has a value of 10% to 60% of a maximum straight distance from one side surface of the bank covering an end of the anode in one of the at least two organic light emitting elements to another side surface of the bank covering an end of the anode in a remaining one of the at least two organic light emitting elements, wherein the characteristic degradation area extends throughout the plurality of organic layers in the area in the common layer corresponding to where the organic light emitting layers of the at least two organic light emitting elements adjacent to each other overlap.

2. The organic light emitting display device according to claim 1, further comprising:
wherein the at least one common layer covers the bank.

3. The organic light emitting display device according to claim 2, wherein the characteristic degradation area corresponds to at least one portion of the bank.

4. The organic light emitting display device according to claim 3, wherein each of a distance from the one side surface of the bank to the characteristic degradation area and a distance from the other side surface of the bank to the characteristic degradation area has a value of 20% or more of the maximum straight distance.

5. The organic light emitting display device according to claim 3, wherein the characteristic degradation area is configured by ultraviolet (UV) ray irradiation.

6. The organic light emitting display device according to claim 3, wherein the characteristic degradation area is a darker in color than another area of the at least one common layer.

7. The organic light emitting display device according to claim 3, wherein a maximum current flowing in the characteristic degradation area is lower than a maximum current flowing in another area of the at least one common layer.

8. The organic light emitting display device according to claim 3, wherein the at least one common layer includes at least one among a hole injecting layer, a hole transporting layer, the organic light emitting layer, an electron transporting layer, an electron injecting layer, and a charge generating layer.

9. An organic light emitting display device comprising: a first anode and a second anode separated from each other on a substrate; a bank between the first anode and the second anode, the bank covering an end of the first anode and an end of the second anode; an organic light emitting unit comprising a plurality of organic layers including at least one common layer covering the first anode, the second anode, and the bank; and a cathode on the organic light emitting unit, wherein a characteristic degradation area is formed in each of the plurality of organic layers disposed on the bank including the one common layer, wherein a current flow characteristic of the characteristic degradation area is different from a current flow characteristic of an area corresponding to the first anode or the second anode included in organic layers disposed on the first anode or the second anode, and wherein the characteristic degradation area is disposed so as not to overlap with the anode, and wherein a width of the characteristic degradation area has a value of 10% to 60% of a maximum straight distance from one side surface of the bank covering an end of the anode in one of the at least two organic light emitting elements to another side surface of the bank covering an end of the anode in a remaining one of the at least two organic light emitting elements, wherein the characteristic degradation area is a darker on color than the area corresponding to the first anode or the second anode.

10. The organic light emitting display device according to claim 9, wherein a maximum current flowing in the characteristic degradation area is lower than a maximum current flowing in the area corresponding to the first anode or the second anode.

11. The organic light emitting display device according to claim 10, wherein the characteristic degradation area is configured by ultraviolet (UV) ray irradiation.

12. The organic light emitting display device according to claim 10, wherein the at least one common layer includes at least one among a hole injecting layer, a hole transporting layer, an organic light emitting layer, an electron transporting layer, an electron injecting layer, and a charge generating layer.

13. An organic light emitting display device comprising: two adjacent pixels; a bank that separates the two adjacent pixels; a plurality of organic common layers covering and sharing the two adjacent pixels and the bank; and an organic light emitting layer on the common layer in each of the two adjacent pixels, and a characteristic degradation area on the bank in each of the plurality of organic common layers, wherein the characteristic degradation partial area in each of the plurality of organic common layers is configured to reduce an amount of leakage current flowing in each of the plurality of organic common layers, and properties of organic materials constituting the characteristic degradation area is different from properties of organic materials constituting a rest of each of the plurality of organic common layers, and wherein the characteristic degradation area is disposed so as not to overlap with the anode, and wherein a width of the characteristic degradation area has a value of 10% to 60% of a maximum straight distance from one side surface of the bank covering an end of the anode in one of the at least two organic light emitting elements to another side surface of the bank covering an end of the anode in a remaining one of the at least two organic light emitting elements, wherein the organic light emitting layer corresponding to the characteristic degradation area is also configured to reduce an amount of leakage current, wherein properties of organic materials constituting the organic light emitting layer corresponding to the characteristic degradation area are also different from properties of organic materials constituting a rest of the organic light emitting layer.

14. The organic light emitting display device according to claim 13, wherein the characteristic degradation area is formed as a result of improper deposition of organic light emitting material due to a mask alignment error.

15. The organic light emitting display device according to claim 13, wherein a structure where element characteristics are degraded is formed by irradiating ultraviolet (UV) rays to the characteristic degradation area.

16. The organic light emitting display device according to claim 15, wherein a maximum current flowing in the characteristic degradation area is lower than a maximum current flowing in another area of each organic common layer.

17. The organic light emitting display device according to claim 16, wherein the plurality of organic common layers include at least one among a hole injecting layer and a hole transporting layer.

18. The organic light emitting display device according to claim 13, wherein the characteristic degradation area is configured to suppress undesired light emission from the bank.

* * * * *